(12) United States Patent
Chu et al.

(10) Patent No.: US 11,017,310 B2
(45) Date of Patent: May 25, 2021

(54) TECHNIQUES FOR COUPLING QUBITS TO ACOUSTIC RESONATORS AND RELATED SYSTEMS AND METHODS

(71) Applicant: Yale University, New Haven, CT (US)

(72) Inventors: Yiwen Chu, New Haven, CT (US); Prashanta Kharel, New Haven, CT (US); William Renninger, New Haven, CT (US); Luke Burkhart, New Haven, CT (US); Luigi Frunzio, North Haven, CT (US); Peter Rakich, New Haven, CT (US); Robert J. Schoelkopf, III, Madison, CT (US)

(73) Assignee: Yale University, New Haven, CT (US)

( * ) Notice: Subject to any disclaimer, the term of this patent is extended or adjusted under 35 U.S.C. 154(b) by 89 days.

(21) Appl. No.: 16/488,215

(22) PCT Filed: Feb. 28, 2018

(86) PCT No.: PCT/US2018/020190
§ 371 (c)(1),
(2) Date: Aug. 22, 2019

(87) PCT Pub. No.: WO2018/160674
PCT Pub. Date: Sep. 7, 2018

(65) Prior Publication Data
US 2020/0234171 A1    Jul. 23, 2020

Related U.S. Application Data

(60) Provisional application No. 62/465,101, filed on Feb. 28, 2017, provisional application No. 62/464,930, filed on Feb. 28, 2017.

(51) Int. Cl.
*H01L 39/22* (2006.01)
*G06N 10/00* (2019.01)
(Continued)

(52) U.S. Cl.
CPC ....... *G06N 10/00* (2019.01); *H01L 29/66977* (2013.01); *H01L 39/223* (2013.01); *H01L 41/113* (2013.01)

(58) Field of Classification Search
None
See application file for complete search history.

(56) References Cited

U.S. PATENT DOCUMENTS 5,835,512 A    11/1998  Wada et al.
8,525,619 B1   9/2013   Olsson et al.
(Continued)

FOREIGN PATENT DOCUMENTS

EP    18760512.6    11/2020

OTHER PUBLICATIONS

U.S. Appl. No. 16/488,223, filed Aug. 22, 2019, Rakich et al.
(Continued)

*Primary Examiner* — Benjamin P Sandvik
(74) *Attorney, Agent, or Firm* — Wolf, Greenfield & Sacks, P.C.

(57) ABSTRACT

Techniques for operating a mechanical oscillator as a quantum memory are described. According to some aspects, a qubit may be coupled to a piezoelectric material such that the electric field of the qubit causes stress within the piezoelectric material. The piezoelectric material may be in contact with a crystalline substrate forming an acoustic resonator such that the qubit couples to bulk acoustic waves in the crystalline substrate via its interaction with the piezoelectric material. According to some aspects, application of a suitable electromagnetic pulse to the qubit may cause an exchange of energy from the qubit to the acoustic phonon system and thereby transfer quantum information from the qubit to the phonon system.

15 Claims, 9 Drawing Sheets

(51) Int. Cl.
*H01L 29/66* (2006.01)
*H01L 41/113* (2006.01)

(56) References Cited

U.S. PATENT DOCUMENTS

| | | | |
|---|---|---|---|
| 8,600,200 | B1 | 12/2013 | Rakich et al. |
| 9,503,063 | B1 | 11/2016 | Abraham et al. |
| 10,573,800 | B1 * | 2/2020 | Najafi .................. H01L 39/24 |
| 2014/0112107 | A1 | 4/2014 | Guo et al. |
| 2016/0125309 | A1 * | 5/2016 | Naaman ................ G06N 10/00 326/3 |
| 2016/0148112 | A1 | 5/2016 | Kwon |
| 2020/0030849 | A1 | 1/2020 | Rakich et al. |
| 2020/0412457 | A1 * | 12/2020 | Bronn .................. H04B 10/70 |

OTHER PUBLICATIONS

Extended European Search Report for European Application No. 18760512.6, dated Nov. 26, 2020.
O'Connell et al., Quantum ground state and single-phonon control of a mechanical resonator. Nature. 2010;464:697-703.
O'Connell et al., Quantum ground state and single-phonon control of a mechanical resonator—Supplementary Information. Nature. 2010;464:697-703.
PCT/US2018/020190, May 30, 2018, International Search Report and Written Opinion.
PCT/US2018/020197, May 29, 2018, International Search Report and Written Opinion.
PCT/US2018/020190, Sep. 12, 2019, International Preliminary Report on Patentability.
PCT/US2018/020197, Sep. 12, 2019, International Preliminary Report on Patentability.
International Search Report and Written Opinion for International Application No. PCT/US2018/020190 dated May 30, 2018.
International Search Report and Written Opinion for International Application No. PCT/US2018/020197 dated May 29, 2018.
Cleland et al., Superconducting qubit storage and entanglement with nanomechancial resonators. Phys Rev Lett. 2004;93(7):070501.
Devoret et al., Superconducting Circuits for Quantum Information: An Outlook. Science. Mar. 8, 2013;339:1169-74. doi: 10.1126/science.1231930.
Gustaffson et al., Propgating phonons coupled to an artificial atom. Science. 2014;346:207-1.
Han et al., Multimode strong coupling in superconducting cavity piezoelectromechanics. Phys Rev Lett. 2016;117:123603.
Hofheinz et al., Synthesizing arbitrary quantum states in a superconducting resonator. Nature. May 28, 2009;459:546-9. doi:10.1038/nature08005.
Lahaye et al., Nanomechanical measurements of a superconducting qubit. Nature. 2009;459:960-4.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Rakich et al., Quantum theory of continuum optomechancis. New J Phys. 2018;20:045005.
Renninger et al., Bulk crystalline optomechanics. Nature Physics. 2018;14(6):601.
Rouxinol et al., Measurements of nanoresonator-qubit interactions in a hybrid quantum electromechanical system. Nanotechnology. 2016;27:364003.
Zou et al., Cavity piezomechanical strong coupling and frequency conversion on an aluminum nitride chip. Phys Rev A. 2016;94:013812.
International Preliminary Report on Patentability for International Application No. PCT/US2018/020190, dated Sep. 12, 2019.
International Preliminary Report on Patentability for International Application No. PCT/US2018/020197, dated Sep. 12, 2019.
U.S. Appl. No. 16/488,233, Rakich, filed Aug. 22, 2019.

* cited by examiner

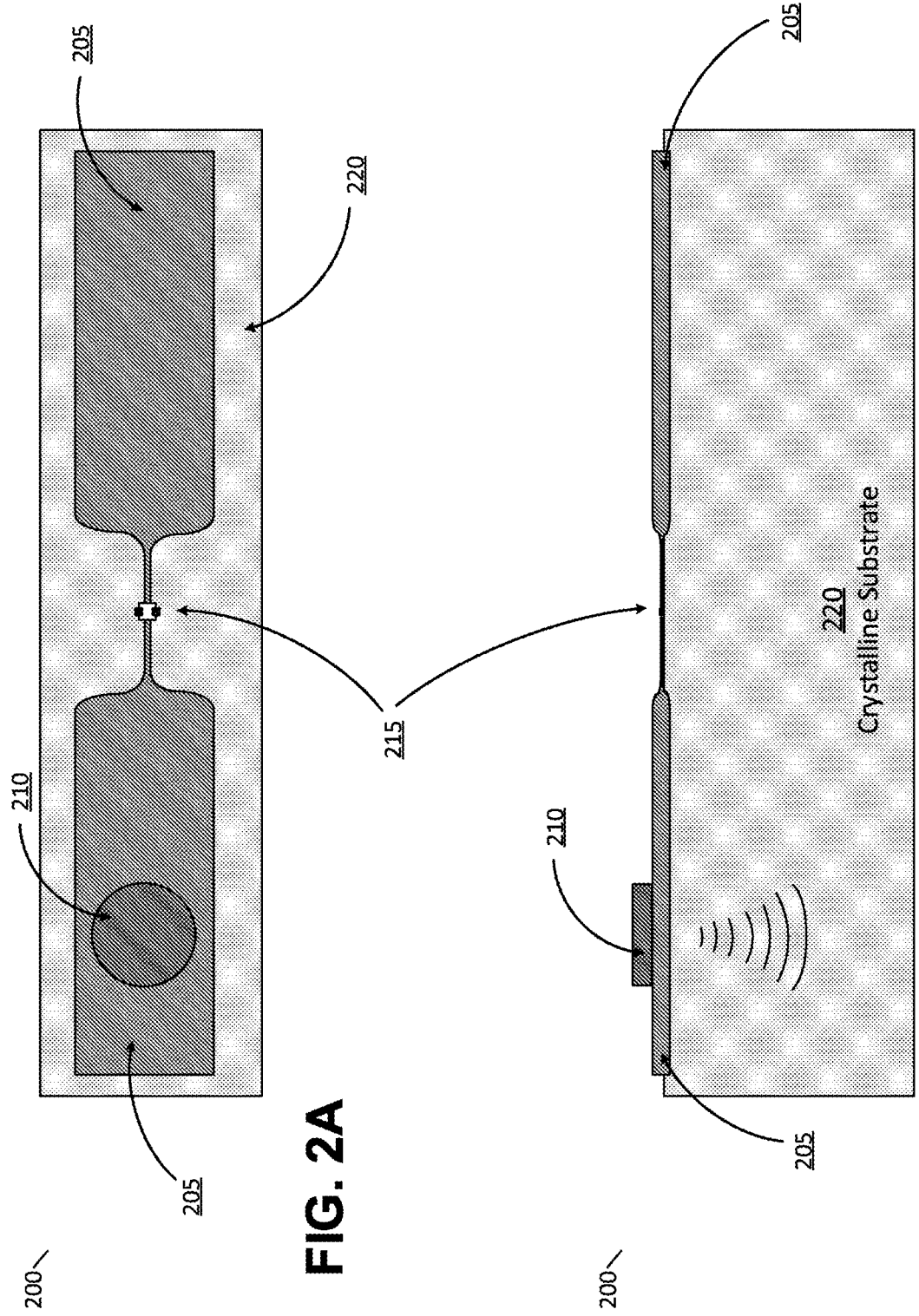

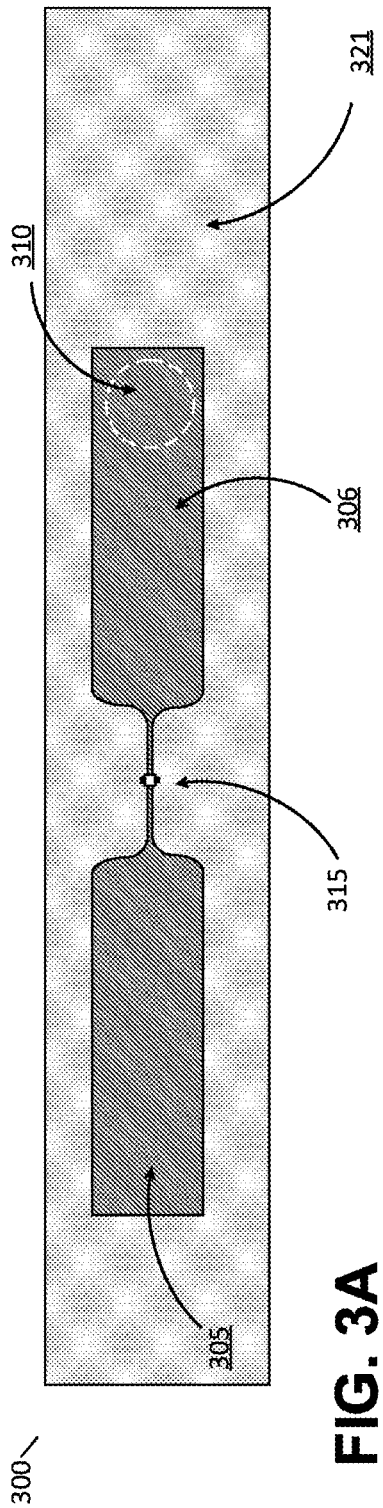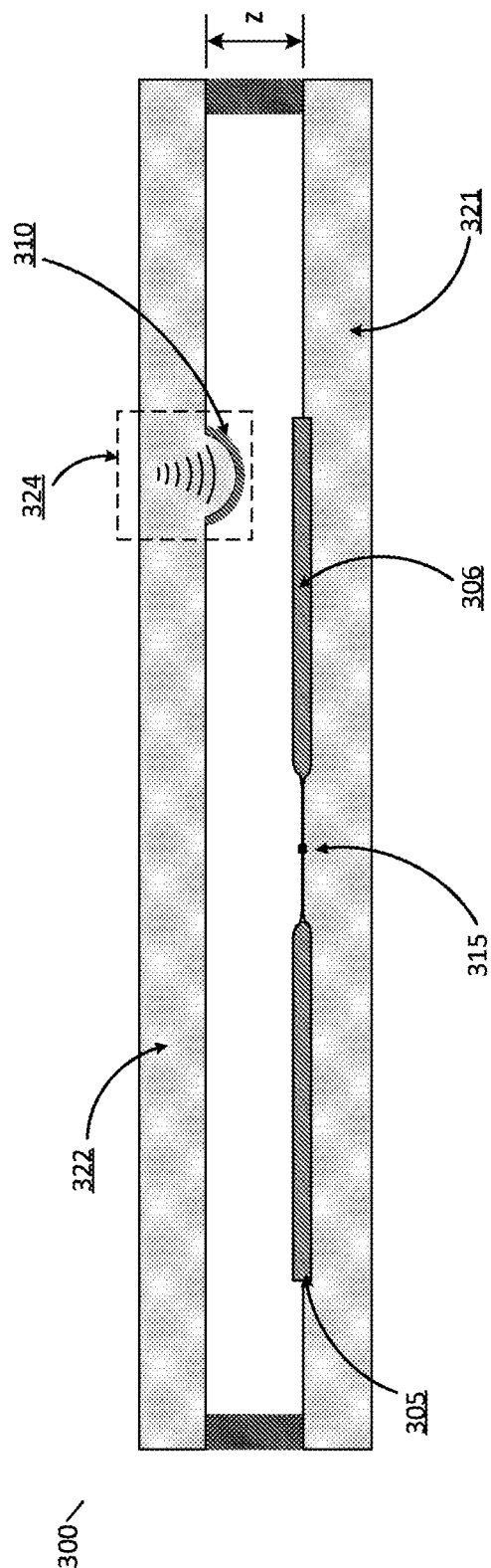

TECHNIQUES FOR COUPLING QUBITS TO ACOUSTIC RESONATORS AND RELATED SYSTEMS AND METHODS

CROSS-REFERENCE TO RELATED APPLICATIONS

This Application is a national stage filing under 35 U.S.C. § 371 of International Patent Application Serial No. PCT/US2018/020190, filed Feb. 28, 2018, which claims priority under 35 USC § 119(e) to U.S. Provisional Patent Application Serial Nos. 62/465,101, filed Feb. 28, 2017 and 62/464,930, filed Feb. 28, 2017. The entire contents of these applications are incorporated herein by reference in their entirety.

GOVERNMENT FUNDING

This invention was made with government support under W911NF-14-1-0011 awarded by United States Army Research Office and under DMR-1119826 awarded by the National Science Foundation. The government has certain rights in the invention.

BACKGROUND

Quantum information processing uses quantum mechanical phenomena, such as energy quantization, superposition, and entanglement, to encode and process information in a way not utilized by conventional information processing. For example, certain computational problems may be solved more efficiently using quantum computation rather than conventional classical computation. However, to become a viable computational option, it may be necessary to precisely control a large number of quantum bits, known as "qubits," and to control interactions between these qubits. In particular, qubits may ideally have long coherence times, be able to be individually manipulated, be able to interact with one or more other qubits to implement multi-qubit gates, be able to be initialized and measured efficiently, and be scalable so that a quantum computer can include large numbers of qubits.

A qubit may be formed from any physical quantum mechanical system with at least two orthogonal states. The two states of the system used to encode information are referred to as the "computational basis." For example, photon polarization, electron spin, and nuclear spin are all two-level systems that may encode information and may therefore each be used as a qubit for quantum information processing. Different physical implementations of qubits have different advantages and disadvantages. For example, photon polarization benefits from long coherence times and simple single qubit manipulation, but suffers from the inability to create simple multi-qubit gates.

SUMMARY

According to some aspects, an apparatus is provided comprising a crystalline substrate formed from a first material, a piezoelectric transducer layer in contact with the substrate, the piezoelectric transducer layer formed from a second material, the second material being different from the first material, and a qubit coupled to the piezoelectric transducer layer such that an electric field produced by the qubit generates stress in the piezoelectric transducer layer.

According to some embodiments, the piezoelectric transducer layer has a convex shape.

According to some embodiments, the substrate comprises a plano-convex portion and the piezoelectric transducer layer is in contact with a convex side of the plano-convex portion of the substrate.

According to some embodiments, the qubit is in contact with the piezoelectric transducer layer.

According to some embodiments, the qubit is a superconducting transmon qubit.

According to some embodiments, the piezoelectric transducer layer is formed over one electrode of the transmon qubit.

According to some embodiments, the piezoelectric transducer layer is in contact with the one electrode of the transmon qubit.

According to some embodiments, the second material comprises aluminum nitride.

According to some embodiments, the first material comprises sapphire.

According to some aspects, a method is provided of operating an acoustic resonator as a quantum memory, the resonator comprising a crystalline substrate formed from a first material, a piezoelectric transducer layer in contact with the substrate, the piezoelectric transducer layer formed from a second material, the second material being different from the first material, and a qubit coupled to the piezoelectric transducer layer such that an electric field produced by the qubit generates stress in the piezoelectric transducer layer, the method comprising applying at least one electromagnetic pulse to the qubit that produces a resonant interaction between the qubit and the crystalline substrate via the piezoelectric transducer layer and that transfers a state of the qubit into a coherent phonon state of the crystalline substrate.

According to some embodiments, the piezoelectric transducer layer has a convex shape.

According to some embodiments, the substrate comprises a plano-convex portion and wherein the convex piezoelectric transducer layer is in contact with a convex side of the plano-convex portion of the substrate.

According to some embodiments, the method further comprises applying a first Stark shift to the qubit without producing a resonant interaction between the qubit and the crystalline substrate, and subsequent to applying the first Stark shift to the qubit, applying a second Stark shift to the qubit, the second Stark shift being said at least one electromagnetic pulse, thereby producing said resonant interaction between the qubit and the crystalline substrate.

According to some embodiments, the qubit is a superconducting transmon qubit.

According to some embodiments, the second material comprises aluminum nitride.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 2A-2C illustrate top, side and perspective views, respectively, of a device in which a qubit may be coupled to acoustic modes of a crystalline substrate via a piezoelectric transducer and in which the qubit is in contact with the piezoelectric transducer, according to some embodiments;

FIGS. 3A-3B illustrate top and side views, respectively, of a device in which a qubit may be coupled to acoustic modes of a crystalline substrate via a piezoelectric transducer and in which the qubit is not in contact with the piezoelectric transducer, according to some embodiments;

DETAILED DESCRIPTION

Figure 1B:
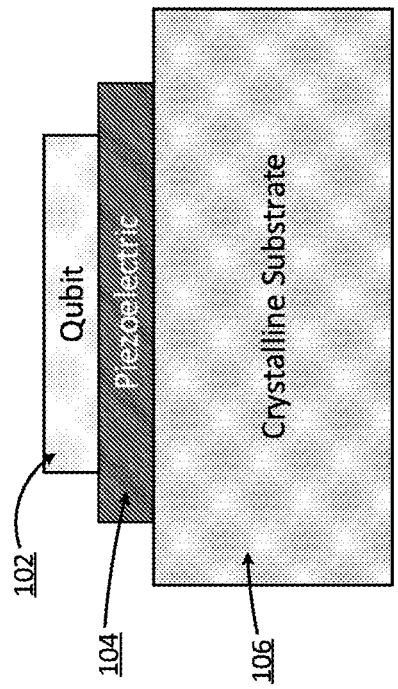
FIGS. 1A and 1B are block diagrams illustrating different configurations in which a qubit may be coupled to acoustic modes of a crystalline substrate via a piezoelectric transducer, according to some embodiments.

The ability to engineer and manipulate many different varieties of quantum mechanical objects can enable the creation of useful hybrid technologies by taking advantage of the objects' unique properties. Thus far, sophisticated quantum states and quantum control have been demonstrated in systems ranging from trapped ions and solid state defects, to superconducting microwave resonators. Some experiments have attempted to apply these techniques to the motion of complex, macroscopic objects, which have important practical applications as memories for storing quantum information or transducers for measuring and interfacing different types of quantum systems.

Developing a quantum computer involves a number of different technical developments, some of which build upon each other. An initial requirements is to build a quantum system that can hold one bit of quantum information (a 'qubit') long enough for the qubit to be written, manipulated, and read. Once this has been achieved, quantum algorithms can be performed on these quantum systems if a number of additional requirements, known as the DiVincenzo criteria, are also satisfied. Although dramatic improvements have been made, however, the best superconducting qubits currently have coherence times on the order of several hundred microseconds to a few milliseconds.

To improve the lifetime of quantum information, some approaches utilize a secondary system that has a longer decoherence time, and in which the quantum information of the qubit can be stored. For instance, in circuit quantum electrodynamics (circuit QED), an electromagnetic oscillator may be coupled to a qubit and the combined system operated to store information in the oscillator that represents the state of the qubit. Since the lifetime of quantum information in the oscillator is significantly greater than that of the qubit, the quantum information can be preserved for longer. If desired, the state of the oscillator can be later transferred back onto the qubit state. Using a secondary system in this manner is sometimes referred to as operating a "quantum memory."

In the field of quantum electro-mechanics, there have been a variety of experimental efforts to couple mechanical motion to superconducting circuits. Some demonstrations involve megahertz frequency micromechanical oscillators parametrically coupled to gigahertz frequency electromagnetic resonators. Because both electrical and mechanical modes are linear, these systems only allow for the generation of Gaussian states of mechanical motion. However, the creation of non-Gaussian states useful for quantum computing, including Fock states and/or Schrödinger cat states, may necessitate the introduction of a source of quantum nonlinearity, such as a qubit.

Some prior systems have featured superconducting qubits coupled to mechanical modes, such as propagating surface acoustic waves or micromechanical resonators, in both the dispersive and resonant regimes. A goal of such work is to reach the regime of quantum acoustics, in which the ability to make, manipulate, and measure non-classical states of light in cavity or circuit QED becomes applicable to mechanical degrees of freedom. This regime is believed to require the strong coupling limit, where the coupling strength g is much larger than the loss rates y, K of both the qubit and the oscillator. Piezoelectric materials are natural choices for achieving large coupling strengths between single electrical and mechanical excitations, and can exhibit coupling strengths as large as tens of MHz, comparable to qubit-photon couplings possible in circuit QED. Conventional devices have been unable, however, to simultaneously achieve coherences and coupling strengths that would allow for sophisticated quantum operations in a robust and easily implemented electromechanical system.

The inventors have recognized and appreciated techniques for operating a mechanical oscillator as a quantum memory. By coupling a qubit to a piezoelectric material, the electric field of the qubit causes stress within the piezoelectric material. The piezoelectric material is in contact with a crystalline substrate forming an acoustic resonator such that the qubit couples to bulk acoustic waves in the crystalline substrate via its interaction with the piezoelectric material. In this manner, the piezoelectric material can be viewed as a piezoelectric "transducer." According to some embodiments, the acoustic resonator can be configured to be a high-overtone bulk acoustic resonator (HBAR) or a film bulk acoustic resonator (FBAR).

According to some embodiments, the qubit can be in physical contact with the piezoelectric transducer or may be in sufficiently close proximity to the piezoelectric transducer to enable electric field changes of the qubit to produce stress within the piezoelectric transducer. Cases where the qubit is in physical contact with the piezoelectric transducer may be easier to fabricate than the alternative approach. Where the qubit is not in contact with the piezoelectric material, however, may allow for a more modular design since the qubit and piezoelectric/crystal elements can be fabricated separately. In either case, no coupling capacitor is necessary between the piezoelectric transducer and the crystalline substrate.

According to some embodiments, a piezoelectric transducer may have a convex shape. Some resonators may include a plano-convex crystal geometry in which coherent acoustic phonon modes may be produced. Such geometries may comprise a piezoelectric transducer material formed in a convex shape (e.g., a dome shape) that contacts some or all of the convex side of a plano-convex crystal structure.

According to some embodiments, the acoustic modes of the crystal may be utilized as a quantum memory via the following procedure. The qubit's interaction with each phonon mode can be effectively turned on or off by tuning it on or off resonance with that mode. The qubit can first be tuned off resonance from the phonon mode (so that the interaction is off) using a combination of magnetic flux and a constant electromagnetic drive. The interaction can then be turned on controllably by changing the amplitude of the electromagnetic drive for some duration. The amplitude and duration can be chosen so that the interaction leads to the transfer of a single electromagnetic excitation of the qubit into a mechanical excitation of the phonon mode. This "swap operation" can be repeated to transfer the mechanical excitation back into the qubit. In this manner, the phonon mode acts as a quantum memory, and experiments using the illustrative system described herein have demonstrated lifetimes of such a memory over several microseconds.

There may be numerous advantages of the acoustic resonator quantum memory described herein, including one or more of the following. First, the resonator may have a smaller physical size than comparable electromagnetic resonators. For instance, a microwave cavity would generally be expected to be have a larger length to support its electromagnetic modes compared with the length scales of the crystal necessary to support the herein-described phonon modes. Second, the acoustic resonator design described herein may have a low qubit loss and low acoustic loss while nevertheless maintaining a sufficiently strong coupling strength between the qubit and acoustic modes of the crystal to reach the necessary coupling limit for transfer of quantum information between the two systems. Third, the acoustic resonator device described herein can be fabricated using relatively straightforward techniques. Fourth, the acoustic resonator, in contrast to electromagnetic resonators, have the ability to couple and interface with other types of quantum systems, such as optical light and other solid-state qubits.

Following below are more detailed descriptions of various concepts related to, and embodiments of, techniques for coupling qubits to acoustic resonators. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 1A:
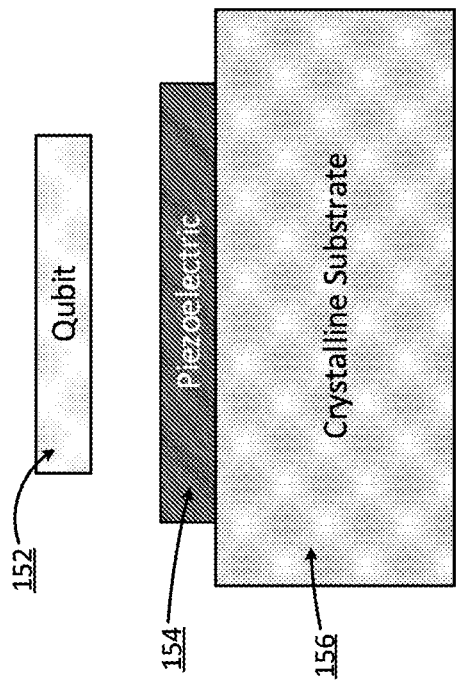

FIGS. 1A and 1B are block diagrams illustrating different configurations in which a qubit may be coupled to acoustic modes of a crystalline material via a piezoelectric transducer, according to some embodiments. Device 100 includes qubit 102 which is in contact with piezoelectric material 104, which in turn is in contact with a crystalline substrate 106. Device 150 includes qubit 152 which is not in contact with piezoelectric material 154, although the qubit 152 may be positioned sufficiently close to piezoelectric material 154 that the electric field of the qubit generates stress in the piezoelectric material. The piezoelectric material 154 is in contact with crystalline substrate 156.

It will be appreciated that where a qubit is referred to as being in contact with a piezoelectric material (as in the case of FIG. 1A), such contact may comprise any physical contact between the piezoelectric material and any one or more components of the qubit. For instance, a piezoelectric material contacting an electrode of a qubit may be considered to be contacting the qubit.

According to some embodiments, qubits 102 and/or 152 may comprise a transmon qubit. Piezoelectric material 104 and/or 154 may comprise any suitable piezoelectric materials, including AlN and/or quartz. Crystalline substrate 106 and/or 156 may comprise any suitable crystalline materials, such as sapphire or diamond.

During operation of device 100 or device 150, the piezoelectricity of the coupled piezoelectric material 104 or 154, respectively, may generate stress $\overleftrightarrow{\sigma}(\vec{x})$ from the qubit's electric field $\vec{E}(\vec{x})$, which acts on the phonon modes's strain field $\overleftrightarrow{s}(\vec{x})$. For simplicity in describing this interaction, we may consider only the dominant tensor components $E \equiv E_3$, $\sigma \equiv \sigma_{33}$, $s \equiv s_{33}$, where the subscript 3 denotes the longitudinal direction perpendicular to the crystalline substrate's surface. Then, the interaction energy between the qubit and the phonon mode is given by:

$$H = -\int \sigma(\vec{x}) s(\vec{x}) dV,$$

where $\sigma(\vec{x}) = c_{33} d_{33}(\vec{x}) E(\vec{x})$ and $c_{33}$ and $d_{33}$ are the stiffness and piezoelectric tensor components, respectively.

Quantizing the fields and equating this to the Jaynes-Cummings Hamiltonian $H_{int} = -\hbar g(ab^\dagger + a^\dagger b)$, where a and b are the annihilation operators for the qubit and phonon modes, respectively, the coupling strength may be estimated as:

$$\hbar g = c_{33} \int d_{33}(\vec{x}) E(\vec{x}) s(\vec{x}) dV$$

Figure 2C:
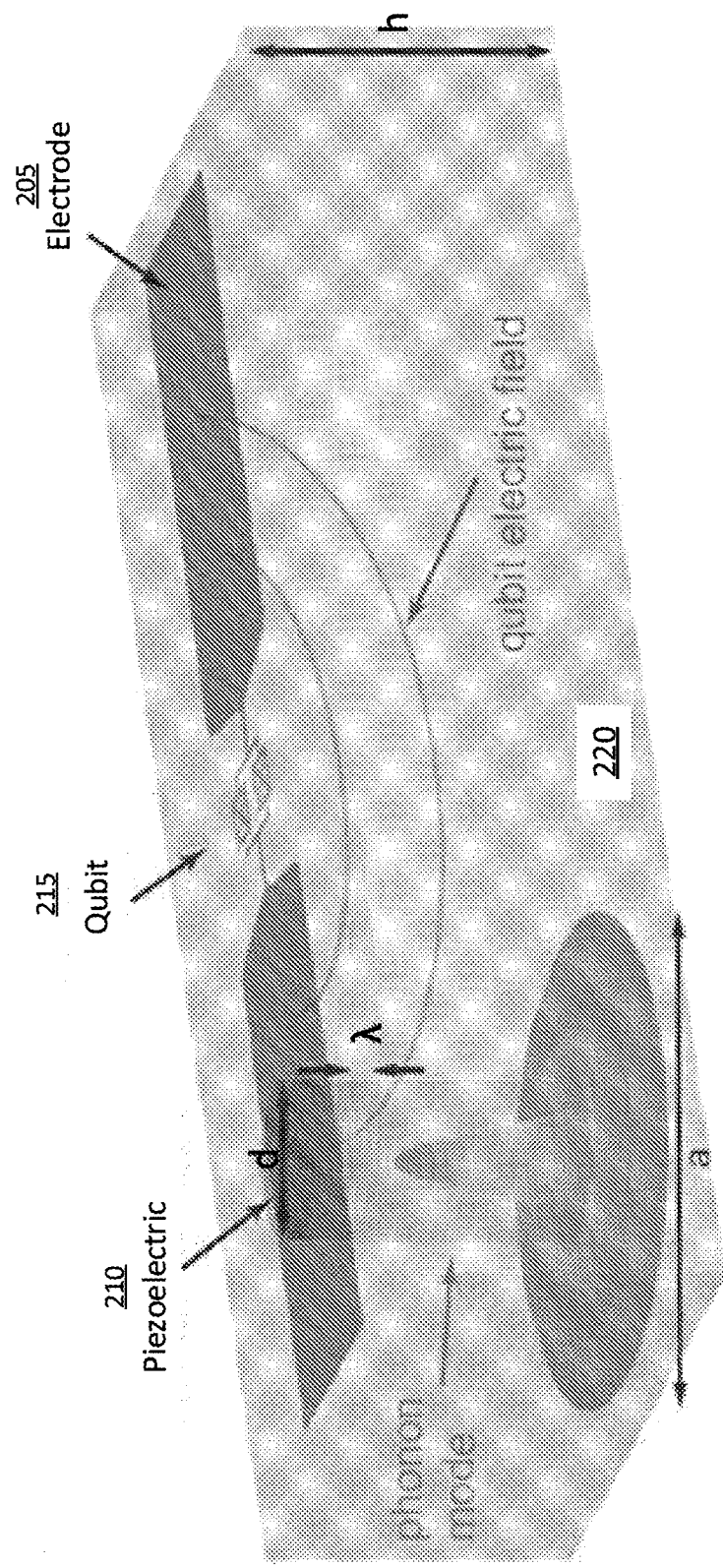

FIGS. 2A-2C illustrate top, side and perspective views, respectively, of a device in which a qubit may be coupled to acoustic modes of a crystalline material via a piezoelectric transducer and in which the qubit is in contact with the piezoelectric transducer, according to some embodiments. Device 200 is an illustrative device in which, as in FIG. 1A, the qubit, piezoelectric and crystalline substrate are in contact with one another.

In the example of FIGS. 2A-2C, a transmon qubit 215 with electrodes 205 is formed on a crystalline substrate 220. A piezoelectric layer in the form of a disc 210 is formed on one of the qubit's electrodes. As shown in FIG. 2C, phonon modes may be produced within the crystalline substrate 220 when the piezoelectric material's stress acts on the phonon mode's strain field. In some embodiments, the crystalline substrate's surfaces may form a phononic Fabry-Pérot resonator that supports longitudinally polarized thickness modes.

The essential character of phonon modes within crystalline substrate 220 will now be described. According to some embodiments, the acoustic wavelength of the phonon modes A may be expected to be much smaller than the dimensions of the piezoelectric layer 210. As a result, the transduced acoustic waves are not expected to diffract significantly and are expected to remain inside the volume of the crystalline substrate for a relatively long time. The spatial character and frequencies of the phonons can be approximated by considering the stationary modes of this cylindrical mode volume, which have strain field distributions given by $$s_{l,m}(\vec{x}) = \beta_{l,m} \sin\left(\frac{l\pi z}{h}\right) J_0\left(\frac{2j_{0,m}r}{d}\right) \quad \text{(Eqn. 1)}$$

where $J_0$ is the zeroth order Bessel function of the first kind and $j_{0,m}$ is the $m^{th}$ root of $J_0$. As shown in FIG. 2C, h is the substrate thickness and d is the diameter of the piezoelectric disc. $\beta_{l,m}$ is a normalization factor corresponding to the root-mean-squared strain amplitude of a single phonon at frequency:

$$\omega_{l,m} = \sqrt{\left(\frac{l\pi}{h}\right)^2 v_l^2 + \left(\frac{2j_{0,m}}{d}\right)^2 v_t^2}. \quad \text{(Eqn. 2)}$$

Here $v_l$ and $v_t$ are the longitudinal and effective transverse sound velocities, respectively. According to this simplified model, the qubit may be described as coupling to discrete modes with distinct longitudinal (l) and transverse (m) mode numbers. For example, the l=503, m=0 phonon mode has a frequency of ~6.65 GHz. $E(\vec{x})$ may be obtained from electromagnetic simulations of a qubit at that frequency and used to estimate the coupling strength g. For the above values, g is estimated to be on the order of $2\pi \times 300$ kHz.

According to some embodiments, in order to reach the strong coupling limit, g needs to be much larger than the mechanical loss, which is expected to be dominated by diffraction out of the finite mode volume into the semi-infinite crystalline substrate 220. To estimate this loss, a second model may be considered that better approximates the actual physical device of FIGS. 2A-2C with a large cylindrical substrate with diameter a>d. Now the qubit can be seen as coupling to an almost continuous set of lossless modes $s'_{l,m}(\vec{x})$, which are also described by Equations 1 and 2, except with d replaced by a. The coherent temporal evolution of these eigenmodes will conspire to reproduce the diffraction loss of the original strain profile within a timescale $\sim a/v_t$. This method may be used to estimate the phonon's diffraction limited lifetime to be on the order of many microseconds. The estimated lifetime confirms the validity of using a simpler model of discrete modes with high quality factors and indicates that this device should be in the strong coupling regime.

It may be noted from these descriptions that the modes of the device of FIGS. 2A-2C are physically very different from conventional micromechanical resonators. Even though the mechanical excitations are not physically confined in all directions, they can nevertheless be described using the well-defined modes of a finite volume. In addition, the described resonators have a much higher quality factor than previously demonstrated micromechanical resonators at the same frequency, and a greater fraction of the mechanical energy of the device resides in an almost perfect crystal rather than in potentially lossy interfaces and surfaces. Combined with the lack of complex fabrication processes that could further increase material dissipation, this device may provide a path toward very low loss mechanical resonators, in analogy to the case of long-lived 3D electromagnetic resonators.

FIGS. 3A-3B illustrate top and side views, respectively, of a device in which a qubit may be coupled to acoustic modes of a crystalline material via a piezoelectric transducer and in which the qubit is not in contact with the piezoelectric transducer, according to some embodiments. In the example of FIGS. 3A-3B, a qubit 315 having electrodes 305 and 306 is formed on top of a first substrate 321. The first substrate 321 is located proximate to, but separated from, a second substrate 322 on which a piezoelectric layer 310 is deposited. In the example of FIGS. 3A-3B, the second substrate 322 includes a plano-convex portion 324, wherein the piezoelectric layer 310 is deposited onto the convex side of the portion 324 forming, for example, a dome shaped layer. FIG. 3A is a top view in which the second substrate 322 and piezoelectric layer 310 are not shown, although a position of the piezoelectric layer is indicated with a dashed circle.

As discussed above, so long as the piezoelectric layer 310 is sufficiently close to the electrode 306 that the electric field of the qubit can produce stress in the piezoelectric layer, the above-described mechanisms by which acoustic modes may be created in the second substrate 322 also apply. As such, the qubit 315 may be coupled to acoustic modes of the substrate 322 via the piezoelectric layer. In some embodiments, the distance z between the two substrates may be between 1 μm and 2 μm.

A plano-convex crystalline structure may support the formation of standing acoustic phonon waves across the structure with little to no diffraction losses. In comparison, supplying light to a crystal structure having opposing planar faces may not always produce a stable resonance because such a geometry may not support stationary acoustic modes that are finite in lateral extent. As a result, coherent phonon modes in a plano-convex crystalline structure may have a coherence length at least as large as the thickness of the structure (thickness t shown in FIG. 3C), and in some cases may be many times greater than the thickness.

Figure 3C:
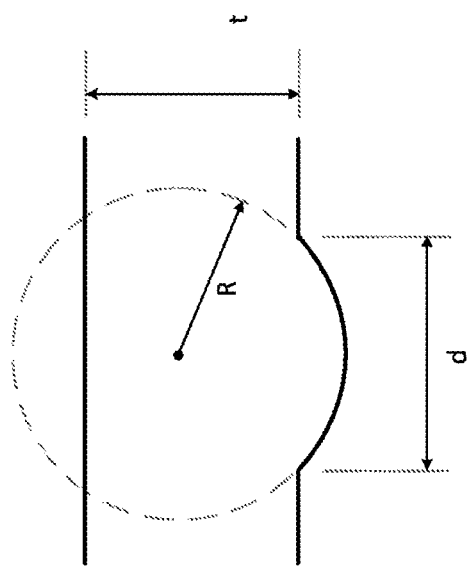
FIG. 3C illustrates dimensions of a plano-convex crystal structure, according to some embodiments.

According to some embodiments, within the framework of Gaussian optical resonator design, it may be expected that only certain radii of curvatures of the plano-convex structure 324 will form stable cavities. FIG. 3C illustrates dimensions of a plano-convex structure (e.g., structure 324) that includes a radius of curvature of the convex surface R, a thickness t, and a diameter d.

According to some embodiments, the cavity represented by a plano-convex crystal structure may be modeled as a Fabry-Pérot optical cavity. Stability criteria for a Fabry-Pérot optical cavity in vacuum consisting of two mirrors with radii of curvatures $R_i$ separated by a distance of L is given by $0 \leq g_1 g_2 \leq 1$, where the stability parameters $g_i = 1 - L/R_i$ for i=1,2. According to some embodiments, correctly formulated stability parameters $g_1$ and $g_2$ may be configured to account for the anisotropy of elastic constants. Acoustic beam propagation in a crystalline media can be non-trivial because acoustic dispersion surfaces are not necessarily symmetric and parabolic, which is the case for optical beam propagation in vacuum. In some cases, the acoustic resonator design may be simplified by choosing crystalline axes about which the dispersion surfaces are parabolic and symmetric to first order. In such cases, stability criteria may be formulated that are similar to those of laser beam optics.

The stability parameters for a plano-convex crystal structure are given by:

$$g_1 = 1, g_2 = 1 - \frac{t}{\chi R}$$

where t is the thickness of the structure, R is the radius of curvature of the convex surface, and χ is an "anisotropy-constant" that includes the effect of propagation of acoustic beam in an anisotropic medium. For acoustic beam propagation perpendicular to, for example, the z-cut face of quartz and x-cut face of silicon, $\chi$ can be calculated analytically yielding $\chi_{Si}=0.6545$ and $\chi_{Quartz}=0.5202$. Therefore, the range of radius of curvatures that may produce stable plano-convex phonon cavities is $0 \leq 1-t/(\chi R) \leq 1$ or equivalently $R \geq t/\chi$. As such, in some embodiments, the radius of curvature R may be selected to be at least 1.5 times the thickness t of the structure, or at least 2 times the thickness t of the structure. For the design of phonon cavities along crystalline axes that produce non-trivial dispersion surfaces, alternative methods such as the numerical acoustic beam propagation techniques may be used.

According to some embodiments, in addition to forming a stable phonon cavity, the radius of curvature R as shown in FIG. 3C may be selected so as to optimize the curvature so that the forcing profile generated by the piezoelectric layer 310 overlaps well with an acoustic mode of interest (e.g., the fundamental mode). Such a selection could also be viewed as a process of maximizing the coupling strength between the qubit and the phonon by suitable selection of the radius of curvature R.

According to some embodiments, the radius of curvature R may be selected so that phonon modes of the plano-convex crystal structure 324 have frequency spacings for particular modes that are much larger than the coupling strength g. For instance, higher order phonon modes may, for suitable radii of curvature, have a sufficient frequency spacing that enables the addressing of individual ones of those modes.

The above-described devices 100, 150, 200 and 300 may each be operated in various ways such that quantum information represented by the qubit's state is transferred to a state of the acoustic phonon system, and vice versa. For instance, an appropriate electromagnetic pulse may be applied to the qubit to produce resonance between the qubit and phonons of the crystalline substrate. Depending on how such a pulse is applied and/or the characteristics of this pulse, various types of quantum information transfer may be performed between the qubit and the phonon system. In this manner, the phonon system may be treated as a quantum memory to which quantum information is transferred and/or from which quantum information is extracted.

According to some embodiments, spectroscopy of a qubit while varying the qubit's frequency with applied flux (in any of devices 100, 150, 200 and 300) may identify a series of anti-crossings, representing frequencies at which the qubit is in resonance with an acoustic mode of a coupled crystalline substrate. As a result, the qubit's interaction with each phonon mode can be effectively turned on and off by tuning the qubit on and off resonance with that mode.

According to some embodiments, to perform quantum operations by tuning the qubit on and off resonance with acoustic modes of a coupled crystalline substrate, the tuning can be performed over a frequency range much larger than g and on a timescale much faster than one vacuum Rabi oscillation period. Such tuning could be achieved using, for example, flux tuning or Stark shifting.

In embodiments in which Stark shifting is employed, the qubit may be Stark shifted with a microwave drive. In some embodiments, a constant flux may be applied to the qubit so that the qubit is at a frequency $\omega_b$ that is close to, but higher than, a qubit frequency needed to produce resonance with a selected acoustic mode. In order to avoid coupling to higher order transverse acoustic modes, a drive detuned from the microwave cavity frequency $v_c$ (e.g., detuned by 100 MHz) may be additionally applied with a constant amplitude that Stark shifts the qubit to $\omega_{or}$, a frequency slightly below the qubit frequency needed to produce resonance with the selected acoustic mode. This is the off resonant frequency of the qubit where it is not interacting with any phonons and can be controlled and measured as an uncoupled qubit. Decreasing the Stark shift amplitude makes the interaction resonant, allowing for the exchange of energy between the qubit and phonon.

For such an exchange of energy to produce a desired exchange of quantum information, parameters of the Stark shift such as amplitude and duration may be identified that, when selected for a Stark shift, produce the desired exchange. To illustrate how such a calibration may be performed, FIG. 4 illustrates data of vacuum Rabi oscillations measured by varying the amplitude and duration of a Stark drive pulse applied to a qubit while it is off resonant from phonon modes of a resonator, according to some embodiments.

Figure 4:
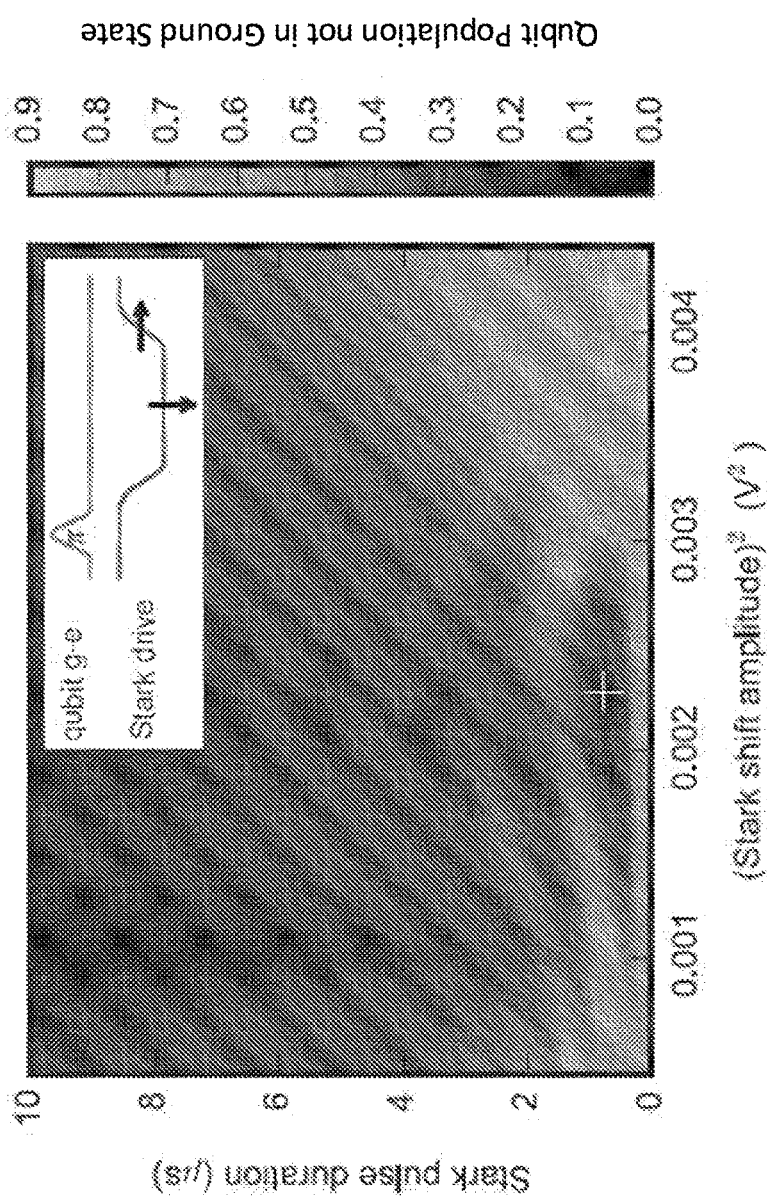
FIG. 4 illustrates measurements of vacuum Rabi oscillations obtained whilst varying the amplitude and duration of a Stark drive pulse applied to a qubit while it is off resonant from phonon modes of a resonator, according to some embodiments.

In the example of FIG. 4, a range of Stark shift amplitudes and durations are evaluated by initially exciting the qubit with a π pulse while it is off resonant from the phonons, then applying a Stark shift as described above with a selected amplitude and duration. The population of the qubit not in the ground state is subsequently evaluated. An ideal Stark shift would put the qubit in the ground state, since this would imply that the excited qubit's energy has been exchanged with the phonon system. As shown in the example of FIG. 4 by the white cross, a particular amplitude and pulse duration may be identified to maximize the efficiency of such an energy exchange.

Figure 5:
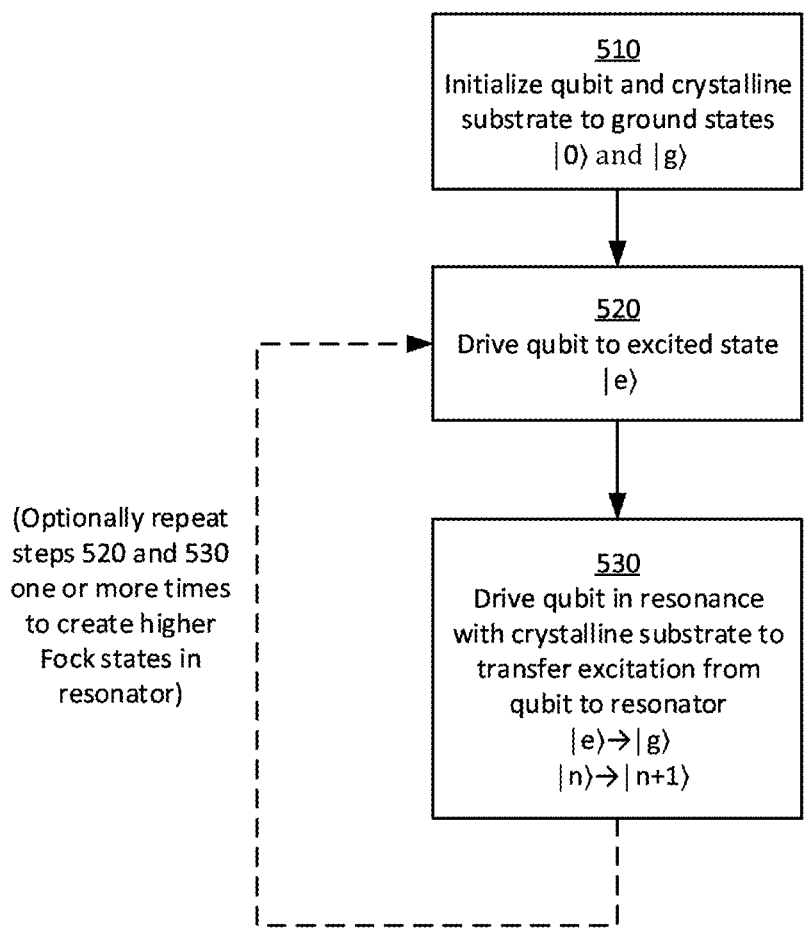
FIG. 5 is a flowchart of a method of storing quantum information in one or more acoustic modes of a resonator, according to some embodiments.

FIG. 5 is a flowchart of a method of storing quantum information in one or more acoustic modes of a resonator, according to some embodiments. Method 500 may be performed with any of devices 100, 150, 200 and/or 300 discussed above, and serves to produce a desired Fock state within a crystalline substrate of the device by transferring energy from a coupled qubit.

Method 500 begins in act 510 in which the qubit and the phonon mode of the crystalline substrate are initialized in corresponding ground states $|g\rangle$ and $|0\rangle$ respectively, where the $n^{th}$ Fock state of the phonon mode is represented as $|n\rangle$. In act 520, the qubit is driven into an excited state $|e\rangle$. In some embodiments, act 520 may comprise application of a π-pulse.

In act 530, an operation is performed upon the system to transfer energy from the excited state of the qubit into the state of the crystalline substrate. As a result, the qubit returns to the ground state $|g\rangle$ and the Fock state of the crystalline substrate transitions from $|n\rangle$ to $|n+1\rangle$. Initially, therefore, the Fock state $|0\rangle$ will transition to the Fock state $|1\rangle$. Acts 520 and 530 may be repeated any number of times to create a desired Fock state within the acoustic modes of the crystalline substrate.

In some embodiments, act 530 may comprise application of a Stark shift with a predetermined amplitude and duration as discussed above. A constant microwave flux may be initially applied to the qubit without producing resonance with the acoustic modes and subsequently the frequency of the Stark drive may be adjusted for some period of time to produce resonance and thereby transfer energy from the qubit to a selected acoustic mode.

Figure 6:
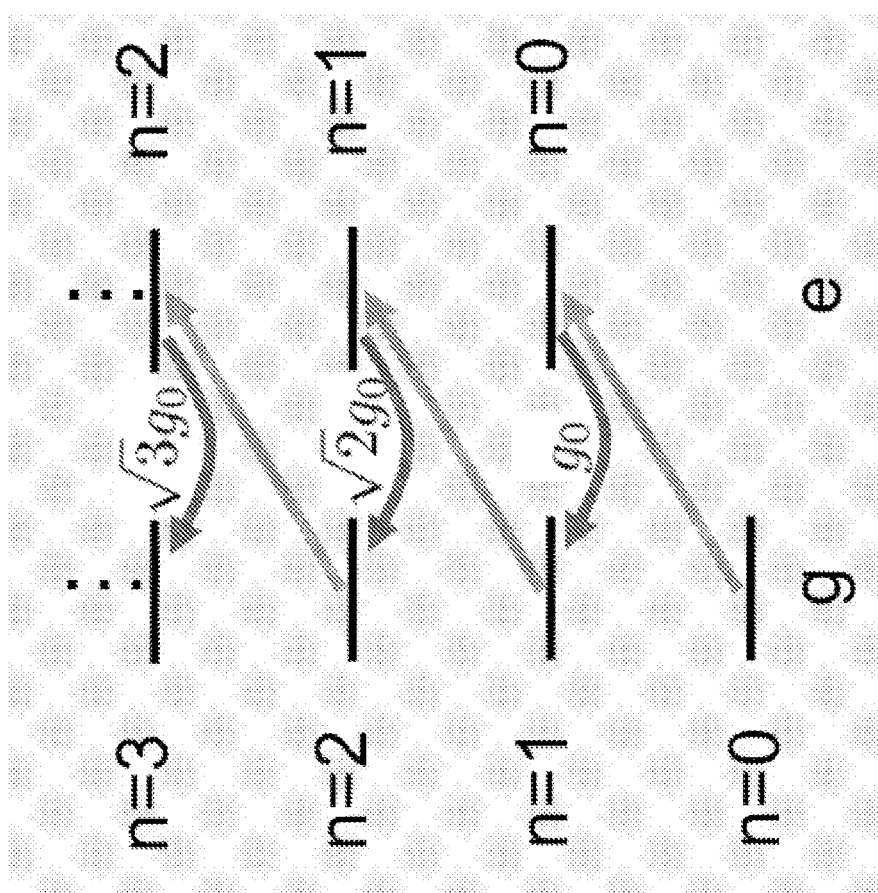
FIG. 6 illustrates a process in which various Fock states may be created in an acoustic resonator by transferring quantum information from a coupled qubit, according to some embodiments.

According to some embodiments, repetition of acts 520 and 530 may utilize a different pulse duration that is based on the initial and final Fock states within act 530. An illustration of such a process is shown in FIG. 6. In the example of FIG. 6, a coupling rate between the qubit and the ground state $|0\rangle$ of the phonon system is denoted by $g_0$. This coupling scales as $\sqrt{n}g_0$ for a given Fock state $|n\rangle$, as shown in FIG. 6. As a result, the time taken for energy to be exchanged between the qubit system and a given Fock state scales as $$\frac{1}{\sqrt{n}\,g_0}.$$

For instance, the duration of a Stark shift performed to transfer energy from the excited state |e⟩ of the qubit and transition an acoustic mode from Fock state |1⟩ to Fock state |2⟩ is $$\frac{1}{\sqrt{2}}$$

of the duration of the Stark shift performed to transition the phonon system from Fock state |0⟩ to Fock state |1⟩. The amplitude of the Stark shift may, however, remain the same for each of these transitions. Similarly, the transition from Fock state |2⟩ to Fock state |3⟩ is achieved with a Stark shift duration that is $$\frac{1}{\sqrt{3}}$$

of the duration of the Fock state that transitions the phonon system from Fock state |0⟩ to Fock state |1⟩, and so forth.

Figure 7A:
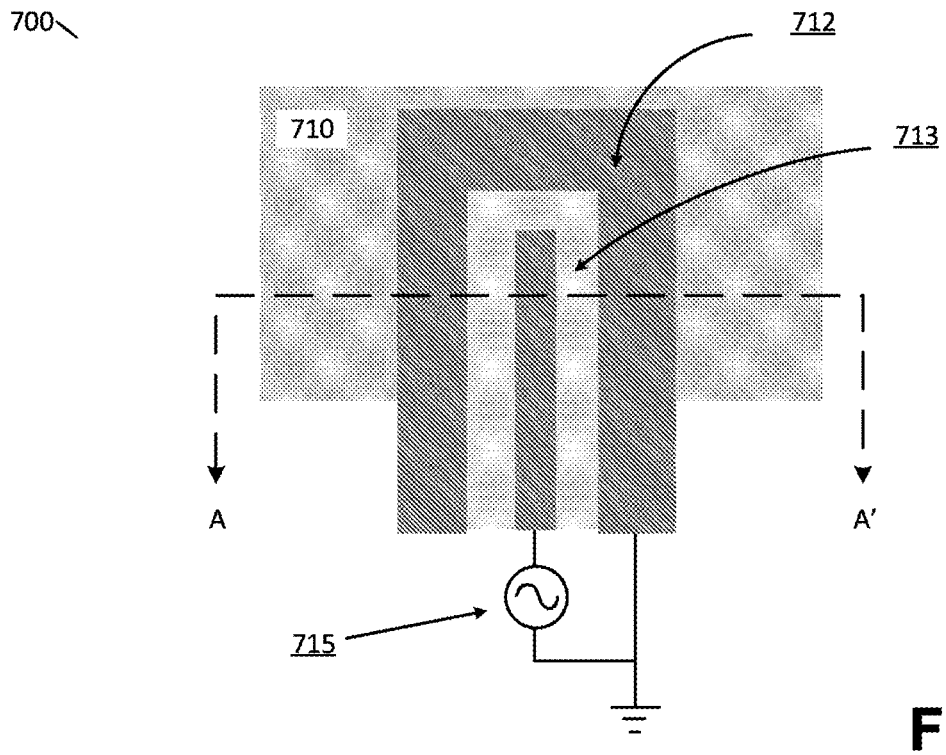
FIGS. 7A-7B illustrate top and side views, respectively, of a device for characterizing piezo-activity of materials and/or surface, according to some embodiments.
Figure 7B:
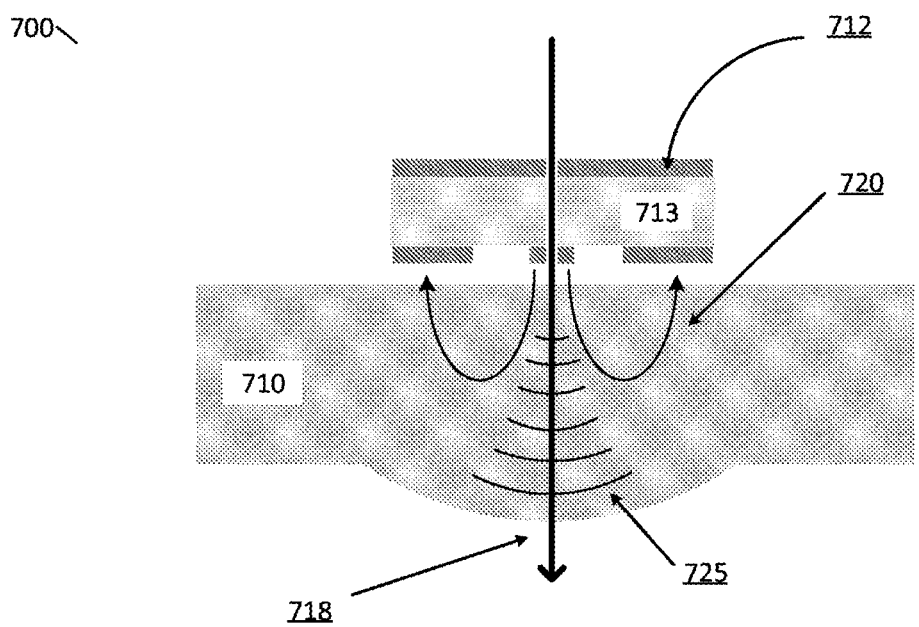

Techniques of producing acoustic phonon modes in a crystalline material through contact with a piezoelectric material as described above may be utilized, independently of a piezoelectric-qubit coupling, to identify and characterize any piezo-activity of the material. To illustrate this technique, FIGS. 7A-7B illustrate top and side views, respectively, of a device for characterizing piezo-activity of materials and/or surface, according to some embodiments. FIG. 7B illustrates a cross section A-A' through the device as shown in FIG. 7A.

In the example of FIGS. 7A-7B, a crystalline material 710 may be examined using a stripline 712 coupled to a coplanar waveguide 713, which together create an AC electric field 720 normal to the surface of the material. A laser beam 718 is simultaneously directed through the crystalline material and detected at the opposing side. When piezoelectric impurities exist in the crystalline material, the AC electric field will couple to these impurities and produce stress, which in turn produces acoustic modes within the bulk of the crystalline material. These acoustic modes may modulate the phase of the laser light passing through the crystalline material, and so by examining the phase and/or amplitude of the laser light that has passed through the crystalline material, the presence of defects may be identified.

In the example of FIGS. 7A-7B, the crystalline material includes a plano-convex structure which, as discussed above, may produce particularly high quality factor and highly coherent phonon modes. As a result, in some embodiments system 700 may be operable to detect the piezoactivity of even a monolayer of defects, crystal asymmetry or impurities at the surface of the crystal, yielding a rapid characterization tool for reducing surface dielectric losses.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus comprising:
a crystalline substrate formed from a first material;
a piezoelectric transducer layer in contact with the substrate, the piezoelectric transducer layer formed from a second material, the second material being different from the first material; and
a qubit coupled to the piezoelectric transducer layer such that an electric field produced by the qubit generates stress in the piezoelectric transducer layer.

2. The apparatus of claim 1, wherein the piezoelectric transducer layer has a convex shape.

3. The apparatus of claim 2, wherein the substrate comprises a plano-convex portion and wherein the piezoelectric transducer layer is in contact with a convex side of the plano-convex portion of the substrate.

4. The apparatus of claim 1, wherein the qubit is in contact with the piezoelectric transducer layer.

5. The apparatus of claim 1, wherein the qubit is a superconducting transmon qubit.

6. The apparatus of claim 5, wherein the piezoelectric transducer layer is formed over one electrode of the transmon qubit.

7. The apparatus of claim 6, wherein the piezoelectric transducer layer is in contact with the one electrode of the transmon qubit.

8. The apparatus of claim 1, wherein the second material comprises aluminum nitride.

9. The apparatus of claim 1, wherein the first material comprises sapphire.

10. A method of operating an acoustic resonator as a quantum memory, the resonator comprising a crystalline substrate formed from a first material, a piezoelectric transducer layer in contact with the substrate, the piezoelectric transducer layer formed from a second material, the second material being different from the first material, and a qubit coupled to the piezoelectric transducer layer such that an electric field produced by the qubit generates stress in the piezoelectric transducer layer, the method comprising:

applying at least one electromagnetic pulse to the qubit that produces a resonant interaction between the qubit and the crystalline substrate via the piezoelectric transducer layer and that transfers a state of the qubit into a coherent phonon state of the crystalline substrate.

11. The method of claim 10, wherein the piezoelectric transducer layer has a convex shape.

12. The method of claim 11, wherein the substrate comprises a plano-convex portion and wherein the convex piezoelectric transducer layer is in contact with a convex side of the plano-convex portion of the substrate.

13. The method of claim 10, further comprising:
applying a first Stark shift to the qubit without producing a resonant interaction between the qubit and the crystalline substrate; and
subsequent to applying the first Stark shift to the qubit, applying a second Stark shift to the qubit, the second Stark shift being said at least one electromagnetic pulse, thereby producing said resonant interaction between the qubit and the crystalline substrate.

14. The method of claim 10, wherein the qubit is a superconducting transmon qubit.

15. The method of claim 10, wherein the second material comprises aluminum nitride.

* * * * *